United States Patent
Classen

(10) Patent No.: US 11,584,634 B2
(45) Date of Patent: Feb. 21, 2023

(54) MICROMECHANICAL COMPONENT AND METHOD FOR MANUFACTURING A MICROMECHANICAL COMPONENT

(71) Applicant: Robert Bosch GmbH, Stuttgart (DE)

(72) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/381,772

(22) Filed: Jul. 21, 2021

(65) Prior Publication Data

US 2022/0048758 A1 Feb. 17, 2022

(30) Foreign Application Priority Data

Aug. 11, 2020 (DE) .......................... 102020210138.8

(51) Int. Cl.
*B81B 3/00* (2006.01)
*G01P 15/08* (2006.01)
*G01P 15/125* (2006.01)

(52) U.S. Cl.
CPC ........ *B81B 3/0013* (2013.01); *G01P 15/0802* (2013.01); *G01P 15/125* (2013.01); *B81B 2201/0235* (2013.01); *G01P 2015/0848* (2013.01); *G01P 2015/0871* (2013.01)

(58) Field of Classification Search
CPC .. G01P 15/125; G01P 15/0802; G01P 15/097; B81B 3/0051; B81B 3/0013; B81B 3/0016; B81B 3/0021; B81B 3/0067
See application file for complete search history.

(56) References Cited

U.S. PATENT DOCUMENTS

| | | | |
|---|---|---|---|
| 2002/0112538 A1* | 8/2002 | Pinter | G01P 15/125 73/514.32 |
| 2010/0258885 A1* | 10/2010 | Wang | B81B 3/001 257/E29.324 |
| 2013/0019678 A1* | 1/2013 | Lazaroff | G01C 19/5762 29/832 |
| 2015/0251897 A1 | 9/2015 | Rastegar | |
| 2017/0082519 A1* | 3/2017 | Blomqvist | G01P 15/0802 |
| 2018/0252744 A1* | 9/2018 | Kamada | G01P 15/18 |
| 2019/0120872 A1 | 4/2019 | Geisberger | |
| 2019/0389722 A1* | 12/2019 | Lehee | B82B 1/006 |
| 2021/0341510 A1* | 11/2021 | Classen | G01P 15/0802 |

FOREIGN PATENT DOCUMENTS

DE 102004013935 A1 12/2004

* cited by examiner

*Primary Examiner* — Helen C Kwok
(74) *Attorney, Agent, or Firm* — Norton Rose Fulbright US LLP; Gerard Messina

(57) ABSTRACT

A micromechanical component for a sensor device. The component includes a first seismic mass, the first seismic mass displaced out of its first position of rest by a first limit distance into a first direction along a first axis mechanically contacting a first stop structure, and including a second seismic mass which is displaceable out of its second position of rest at least along a second axis, the second axis lying parallel to the first axis or on the first axis, and a second stop surface of the second seismic mass, displaced out of its second position of rest into a second direction counter to the first direction along the second axis, mechanically contacting a first stop surface of the first seismic mass adhering to the first stop structure.

10 Claims, 7 Drawing Sheets

MICROMECHANICAL COMPONENT AND METHOD FOR MANUFACTURING A MICROMECHANICAL COMPONENT

CROSS REFERENCE

The present application claims the benefit under 35 U.S.C. § 119 of German Patent Application No. DE 102020210138.8 filed on Aug. 11, 2020, which is expressly incorporated herein by reference in its entirety.

FIELD

The present invention relates to a micromechanical component for a sensor device. The present invention likewise relates to a method for manufacturing a micromechanical component for a sensor device.

BACKGROUND INFORMATION

FIG. 1 shows a schematic representation of a conventional acceleration sensor which is Applicant's internal state of the art.

The conventional acceleration sensor represented schematically in FIG. 1 has two seismic masses 10, which in each case are connected via two spring devices 12 each to a mount 14 in such a way that the two seismic masses 10 are able to be set into oscillatory motion oriented along an axis 16. The two seismic masses 10 are placed "one after the other" in such a way that axis 16 intersects each of the two seismic masses 10 in the middle. However, a distance d between the two seismic masses 10 is selected to be great enough that no mechanical contact occurs between the two seismic masses 10 even during their oscillatory motion along axis 16.

Formed on seismic masses 10 are actuator electrodes 18, which are assigned stator electrodes 20 secured to mount 14. An effect on the conventional acceleration sensor in FIG. 1 of an acceleration with a non-zero acceleration component oriented along axis 16 causes a displacement of the two seismic masses 10 out of their positions of rest represented in FIG. 1, so that a respective interspace between each of actuator electrodes 18 and the at least one stator electrode 20 assigned in each case changes. Utilizing conductor tracks 22 formed on mount 14, it is possible to detect the change of the respective interspace between actuator electrodes 18 and assigned stator electrodes 20 in order to substantiate or measure the acceleration component oriented along axis 16.

In addition, for each of the two seismic masses, the conventional acceleration sensor from FIG. 1 has one first stop structure 24 each and one second stop structure 26 each. First stop structures 24 are secured to mount 14 in such a way that seismic mass 10 assigned in each case, upon its displacement out of its position of rest by a first limit distance into a first direction along axis 16, mechanically contacts assigned first stop structure 24. Correspondingly, second stop structures 26 are also disposed fixedly on mount 14 in such a way that seismic mass 10 assigned in each case, after its displacement out of its position of rest by a second limit distance into a second direction counter to the first direction along axis 16, mechanically contacts assigned second stop structure 26.

SUMMARY

The present invention provides a micromechanical component for a sensor device and a method for manufacturing a micromechanical component for a sensor device.

An example embodiment of the present invention may provide advantageous possibilities for preventing an unwanted adhesion or stiction of at least the first seismic mass of a micromechanical component, equipped in each case with two seismic masses, to at least a first stop structure—assigned to the first seismic mass—of a mount of the micromechanical component. The example embodiment of the present invention therefore helps to improve the mechanical robustness and/or overload strength of such micromechanical components. Consequently, a micromechanical component realized with the aid of the example embodiment of the present invention may also be subjected to a load profile with increasing demands in terms of ruggedness, without (significantly) impairing the measuring accuracy or measuring reliability of a sensor device utilizing the micromechanical component in question. For example, the sensor device equipped with the micromechanical component according to the present invention may be used advantageously as an inertial sensor in a stylus of a tablet or a smart phone, even though the micromechanical component of the present invention is occasionally subject to hard shocks during such a usage.

In addition, a micromechanical component according to an example embodiment of the present invention may also be made comparatively small without the miniaturization of the micromechanical component of the invention having a (significant) adverse affect on its robustness with respect to shock loads. By miniaturizing the micromechanical component according to an example embodiment of the present invention, it is possible to save on manufacturing costs, while the comparatively good mechanical ruggedness/overload strength of the miniaturized mechanical component also leads to savings in repair and replacement costs.

In one advantageous specific embodiment of the micromechanical component, the first seismic mass, displaced out of its first position of rest by a second limit distance into the second direction along the first axis, mechanically contacts a second stop structure of the mount, the first seismic mass and the second seismic mass being disposed relative to each other in such a way that a fourth stop surface of the second seismic mass, displaced out of its second position of rest into the first direction along the second axis, mechanically contacts a third stop surface of the first seismic mass adhering to the second stop structure. As will become clear from the following description, with the aid of the mechanical contact of the fourth stop surface with the third stop surface, an impulse is able to be transmitted in such a way from the second seismic mass to the first seismic mass adhering to the second stop structure, that the first seismic mass detaches from the second stop structure.

Preferably, the first seismic mass and the second seismic mass are disposed relative to each other in such a way that a first distance of the first stop surface of the first seismic mass in its first position of rest to the second stop surface of the second seismic mass in its second position of rest is greater than the first limit distance and equal to or less than double the first limit distance, and/or a second distance of the third stop surface of the first seismic mass in its first position of rest to the fourth stop surface of the second seismic mass in its second position of rest is greater than the second limit distance and equal to or less than double the second limit distance. Such a ratio of size between the first distance and the first limit distance and between the second distance and the second limit distance, respectively, makes it possible to reliably ensure that a mechanical contact of the first stop surface with the second stop surface or a mechanical contact of the third stop surface with the fourth stop surface will always take place if an unwanted adhesion/stiction of the first seismic mass to the first stop structure or to the second stop structure exists.

In a further advantageous specific embodiment of the micromechanical component in accordance with the present invention, the first stop surface is formed on a first limit-stop structure of the first seismic mass, the second stop surface is formed on a second limit-stop structure of the second seismic mass, the third stop surface is formed on a third limit-stop structure of the first seismic mass and/or the fourth stop surface is formed on a fourth limit-stop structure of the second seismic mass. As will become clear from the following description of the figures, the first limit-stop structure, the second limit-stop structure, the third limit-stop structure and/or the fourth limit-time structure may be formed with relatively great freedom of design.

For example, the first limit-stop structure of the first seismic mass, the second limit-stop structure of the second seismic mass, the third limit-stop structure of the first seismic mass and/or the fourth limit-stop structure of the second seismic mass may in each instance take the form of a flexible limit-stop structure. In this case, a mechanical contact leads to a slight deflection of the respective limit-stop structure, and consequently to an additional restoring force. At the same time, the elasticity of the respective limit-stop structure ensures that the stop surface formed on it is damaged less frequently. Alternatively, however, the first limit-stop structure of the first seismic mass, the second limit-stop structure of the second seismic mass, the third limit-stop structure of the first seismic mass and/or the fourth limit-stop structure of the second seismic mass may in each case also take the form of a firm limit-stop structure.

In one particularly advantageous specific embodiment of the micromechanical component of the present invention, the first limit-stop structure of the first seismic mass extends at least partially into a first lateral recess of the second seismic mass open toward the first axis, the second limit-stop structure of the second seismic mass extends at least partially into a second lateral recess of the first seismic mass open toward the second axis, the third limit-stop structure of the first seismic mass extends at least partially into a third lateral recess of the second seismic mass open toward the first axis and/or the fourth limit-stop structure of the second seismic mass extends at least partially into a fourth lateral recess of the first seismic mass open toward the second axis. This yields great freedom of design in optimizing the positions of limit-stop structures.

In addition, implementation of a corresponding method for manufacturing a micromechanical component for a sensor device also provides the advantages explained above; the manufacturing method may be further developed according to the specific embodiments of the micromechanical component described above.

BRIEF DESCRIPTION OF THE DRAWINGS

Further features and advantages of the present invention are explained below with reference to the figures.

DETAILED DESCRIPTION OF EXAMPLE EMBODIMENTS

Figure 1:
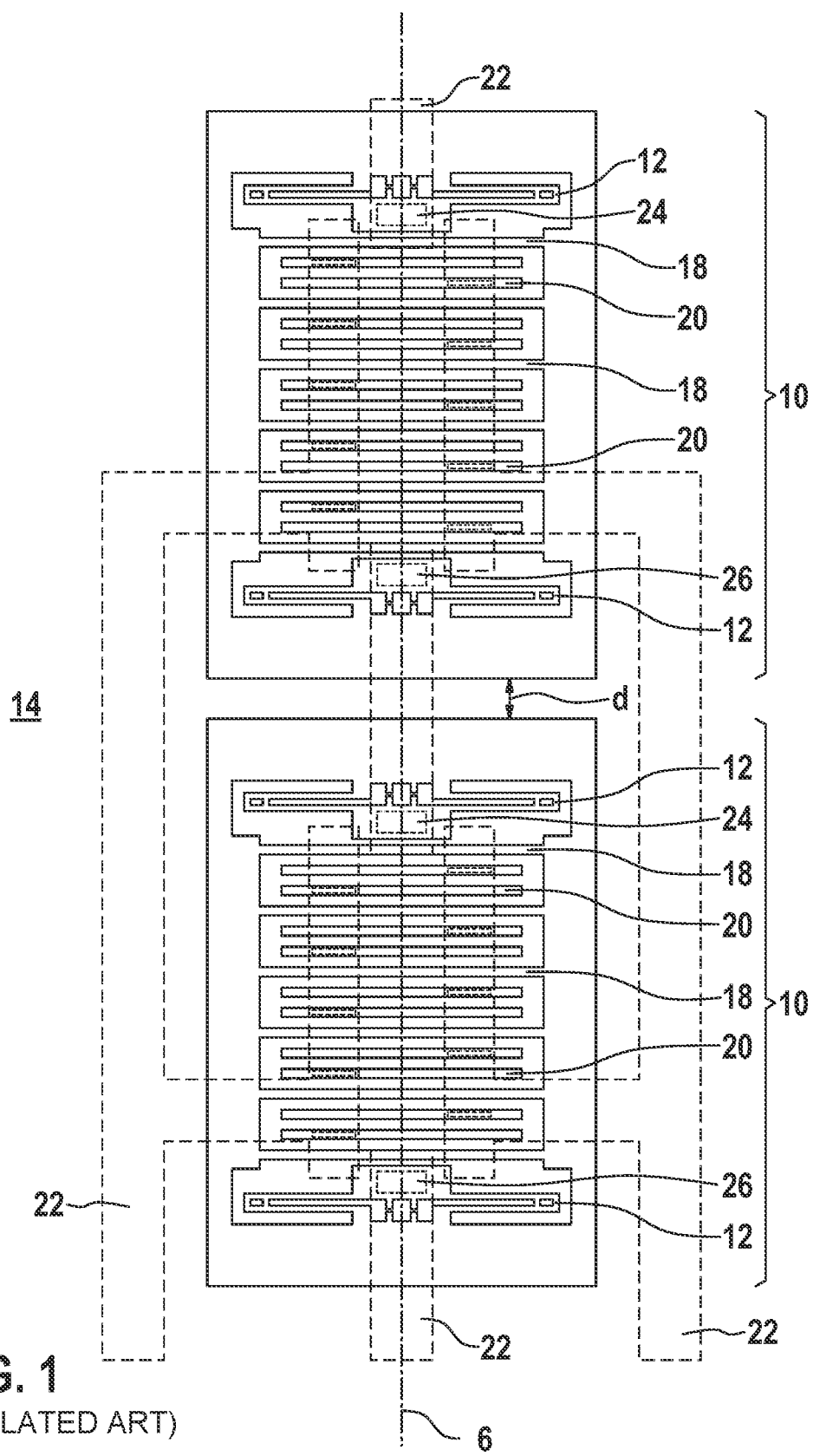
FIG. 1 shows a schematic representation of a conventional acceleration sensor of the related art.
Figure 2A:
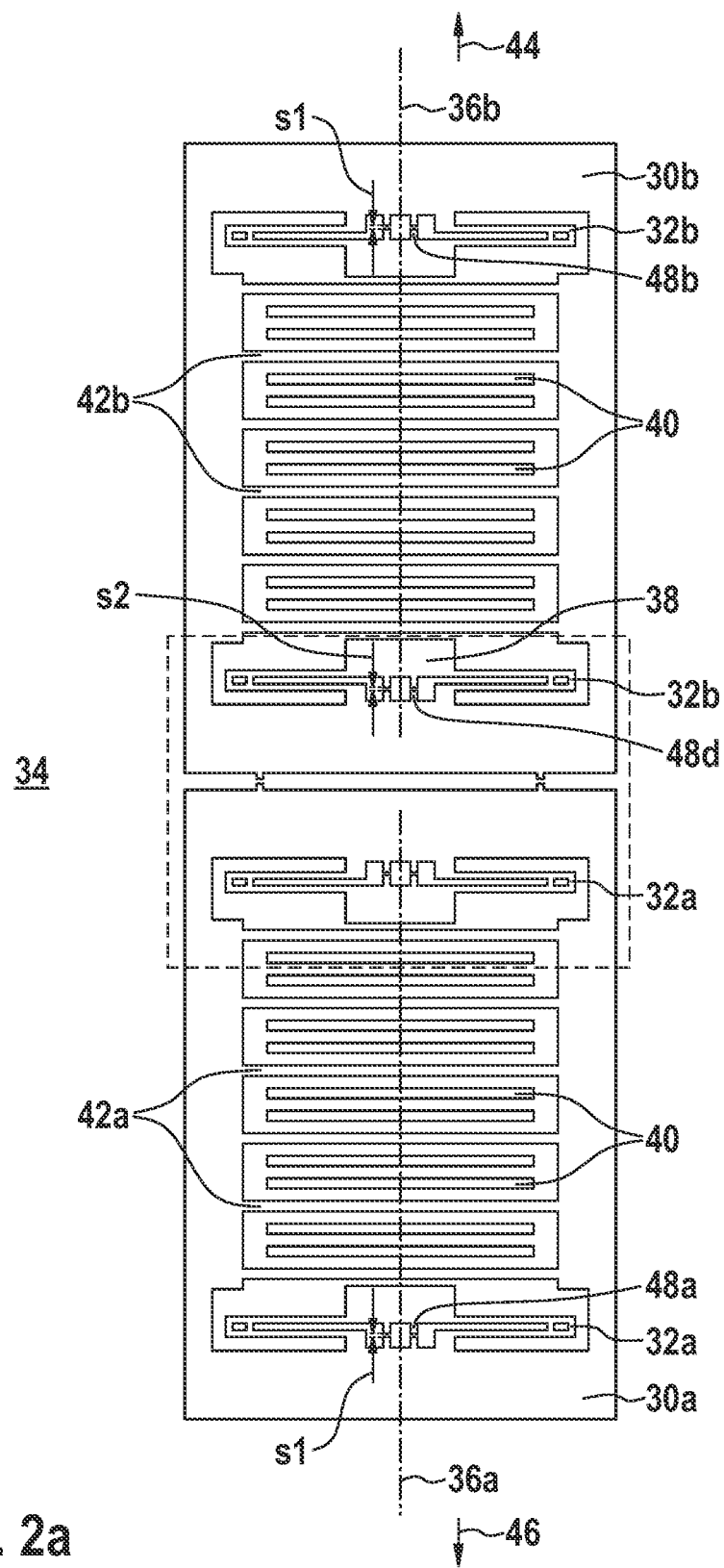
FIGS. 2a and 2b show schematic representations of a first specific embodiment of the micromechanical component of the present invention.
Figure 2B:
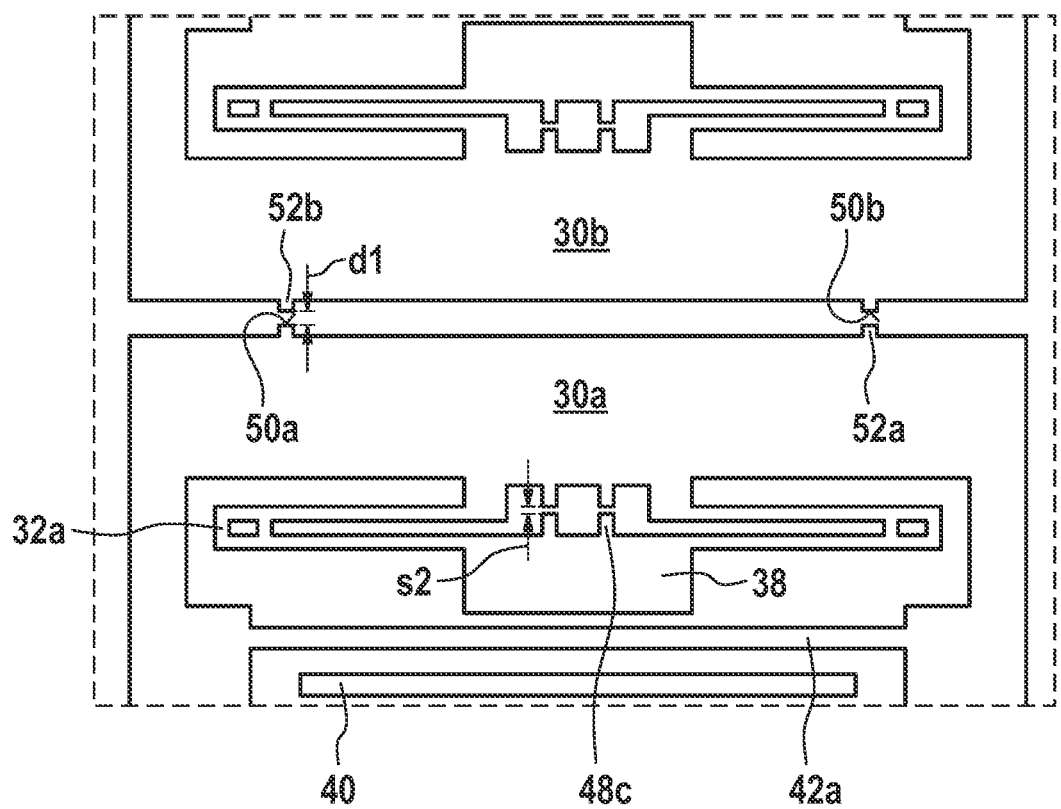

FIGS. 2a and 2b show schematic representations of a first specific embodiment of the micromechanical component in accordance with the present invention.

The micromechanical component shown schematically in FIG. 2a has a first seismic mass 30a which is connected by at least one first spring device 32a to a mount 34 of the micromechanical component in such a way that first seismic mass 30a is displaceable out of its first position of rest at least along a first axis 36a in relation to mount 34, accompanied by deformation of the at least one first spring device 32a. In addition, the micromechanical component has a second seismic mass 30b which is connected by at least one second spring device 32b to mount 34 in such a way that second seismic mass 30b is displaceable out of its second position of rest at least along a second axis 36b in relation to mount 34, accompanied by deformation of the at least one second spring device 32b. Merely by way of example, in the case of the micromechanical component of FIGS. 2a and 2b, second axis 36b lies on first axis 36a. The two seismic masses 30a and 30b are thus disposed "one after the other" along first/second axis 36a and 36b. Alternatively, second axis 36b may also lie parallel to first axis 36a.

Mount 34 is represented only schematically in the example of FIGS. 2a and 2b. For example, two support posts 38 each per seismic mass 30a and 30b and several stator electrodes 40 per seismic mass 30a and 30b are shown. Support posts 38 and stator electrodes 40 each take the form of fixed/non-displaceable components of mount 34. Each seismic mass 30a and 30b is connected via one first/second spring device 32a or 32b each to the two support posts 38 assigned to it. In addition, each seismic mass 30a and 30b is formed with actuator electrodes 42a or 42b which are able to interact with stator electrodes 40 assigned to it, in the manner described below. However, it is pointed out explicitly here that the design of mount 34 with support posts 38 and/or stator electrodes 40 is to be interpreted only by way of example.

First seismic mass 30a is displaceable out of its first position of rest shown in FIG. 2a along first axis 36a both into a first direction 44 and into a second direction 46 counter to first direction 44. Second seismic mass 30b is also displaceable out of its second position of rest shown in FIG. 2a along second axis 36b both into first direction 44 and into second direction 46. In addition, at least for first seismic mass 30a, mount 34 includes a first stop structure 48a which is disposed in such a way relative to first seismic mass 30a that first seismic mass 30a, displaced out of its first position of rest by a first limit distance s1 into first direction 44 along first axis 36a, mechanically contacts first stop structure 48a. A displacement movement of first seismic mass 30a out of its first position of rest along first axis 36a into first direction 44 is thus limited with the aid of first stop structure 48a (as a rule) to first limit distance s1. As an advantageous supplement, mount 34 additionally has a second stop structure 48b for second seismic mass 30b, as well, second stop structure 48b being disposed relative to second seismic mass 30b in such a way that second seismic mass 30b, displaced out of its second position of rest by first limit distance s1 into second direction 46 along second axis 36b, mechanically contacts second stop structure 48b. Thus, a displacement movement of second seismic mass 30b out of its second position of rest along second axis 36b into second direction 46 is able to be limited with the aid of second stop structure 48b (as a rule) to first limit distance s1, as well. First stop structure 48a and/or second stop structure 48b is/are preferably disposed or formed on mount 34 in such a way that first stop structure 48a and/or second stop structure 48b is/are only displaceable through damage to mount 34.

FIG. 2b shows an enlarged section from FIG. 2a. As discernible in FIG. 2b, first seismic mass 30a and second seismic mass 30b are disposed relative to each other in such a way that a first stop surface 50a of first seismic mass 30a and a second stop surface 50b of second seismic mass 30b are able to be brought together in a mechanical contact. In particular, seismic masses 30a and 30b are disposed and aligned relative to each other in such a way that second stop surface 50b of second seismic mass 30b, displaced out of its second position of rest into second direction 46 along second axis 36b, mechanically contacts first stop surface 50a of first seismic mass 30a adhering to its first stop structure 48a. With the aid of the mechanical contact between first stop surface 50a and second stop surface 50b, an impulse transfer is possible from second seismic mass 30b to first seismic mass 30a, such that first seismic mass 30a, adhering to its first stop structure 48a, is detached/struck loose again from first stop structure 48a. An unwanted adhesion or stiction of first seismic mass 30a to its first stop structure 48a is thus quickly rectifiable again. The advantageous placement of seismic masses 30a and 30b relative to each other shown schematically in FIG. 2b therefore improves the mechanical ruggedness and overload strength of the micromechanical component.

In addition, because of the advantageous placement of seismic masses 30a and 30b relative to each other, first stop surface 50a of first seismic mass 30a, displaced out of its first position of rest into first direction 44 along first axis 36a, mechanically contacts second stop surface 50b of second seismic mass 30b adhering to its second stop structure 48b, so that an impulse is transmitted from first seismic mass 30a to second seismic mass 30b. Therefore, an unwanted adhesion or stiction of second seismic mass 30b to its second stop structure 48b is quickly rectifiable again, as well. This contributes to the additional improvement in the mechanical ruggedness and/or overload strength of the micromechanical component. Even in the event mechanical loads (thus, non-static accelerations) occur, when one of seismic masses 30a or 30b comes in mechanical contact with first/second stop structure 48a or 48b assigned to it, the state of stiction of respective seismic mass 30a or 30b on first/second stop structure 48a or 48b assigned to it is quickly removed again, so that the micromechanical component is transferred again into its fully functional state. Since it is extremely unlikely that upon an occurrence of dynamic loads, both seismic masses 30a and 30b would stick simultaneously to first/second stop structures 48a and 48b assigned to them, therefore in the event of a state of stiction of one seismic mass 30a or 30b, the other seismic mass 30a or 30b will still always cause adhering seismic mass 30a or 30b to be released or struck loose.

The advantageous placement of first seismic mass 30a and second seismic mass 30b relative to each other is achieved, for example, when a first distance d1 of first stop surface 50a of first seismic mass 30a in its first position of rest to second stop surface 50b of second seismic mass 30b in its second position of rest is greater than first limit distance s1 and equal to or less than double first limit distance s1. This ensures advantageous displaceability of the two seismic masses 30a and 30b during operation of the micromechanical component, a mechanical contact of seismic masses 30a and 30b at their stop surfaces 50a and 50b generally only occurring in the event one of the two seismic masses 30a and 30b adheres to stop structure 48a or 48b assigned to it.

In the case of the micromechanical component of FIGS. 2a and 2b, first stop surface 50a is formed on a first limit-stop structure 52a of first seismic mass 30a and second stop surface 50b is formed on a second limit-stop structure 52b of second seismic mass 30b. In particular, limit-stop structures 52a and 52b may take the form of knop-like limit-stops or knop-like limit-stop structures. In addition, first seismic mass 30a and second seismic mass 30b may also be formed with a plurality of first/second stop surfaces 50a and 50b, that is, with a plurality of first/second limit-stop structures 52a and 52b.

As an optional further development, the micromechanical component of FIGS. 2a and 2b also has a third stop structure 48c which is disposed/formed on mount 34 in such a way that first seismic mass 30a, displaced out of its first position of rest by a second limit distance s2 into second direction 46 along first axis 36a, mechanically contacts third stop structure 48c of mount 34. Correspondingly, a fourth stop structure 48d is disposed/formed on mount 34 in such a way that second seismic mass 30b, displaced out of its second position of rest by second limit distance s2 into first direction 44 along second axis 36b, mechanically contacts fourth stop structure 48d. The displacement movements of first seismic mass 30a out of its first position of rest along first axis 36a into second direction 46 and/or of second seismic mass 30b out of its second position of rest along second axis 36b into first direction 44 are therefore also limited with the aid of third/fourth stop structures 48c and 48d (as a rule) to second limit distance s2. Second limit distance s2 may be equal or not equal to first limit distance s1. Third stop structure 48c and/or fourth stop structure 48d is/are preferably disposed or formed on mount 34 in such a way that third stop structure 48c and/or fourth stop structure 48d is/are only displaceable through damage to mount 34. Merely by way of example, in the case of the micromechanical component of FIGS. 2a and 2b, stop structures 48a to 48d are formed on the supporting posts.

Figure 3A:
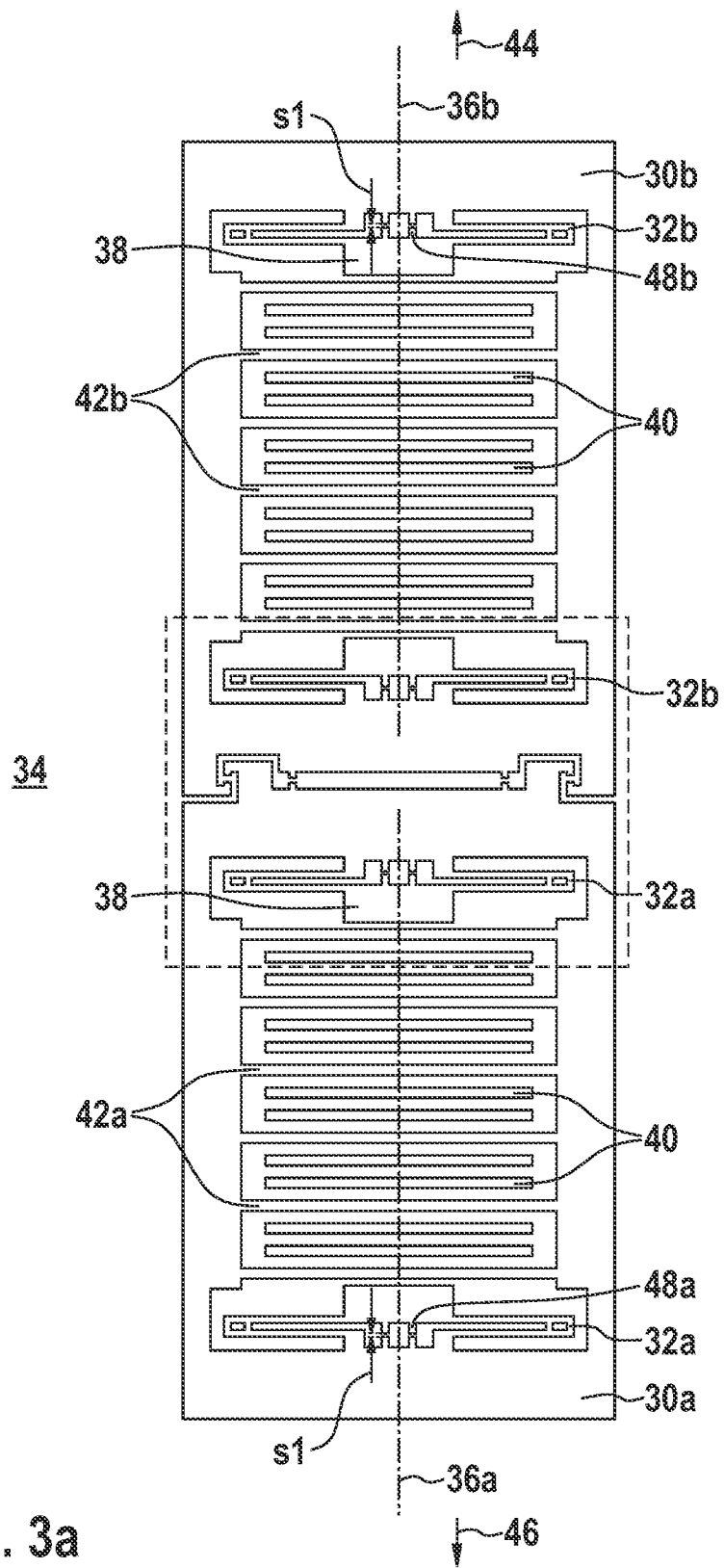
FIGS. 3a and 3b show schematic representations of a second specific embodiment of the micromechanical component of the present invention.
Figure 3B:
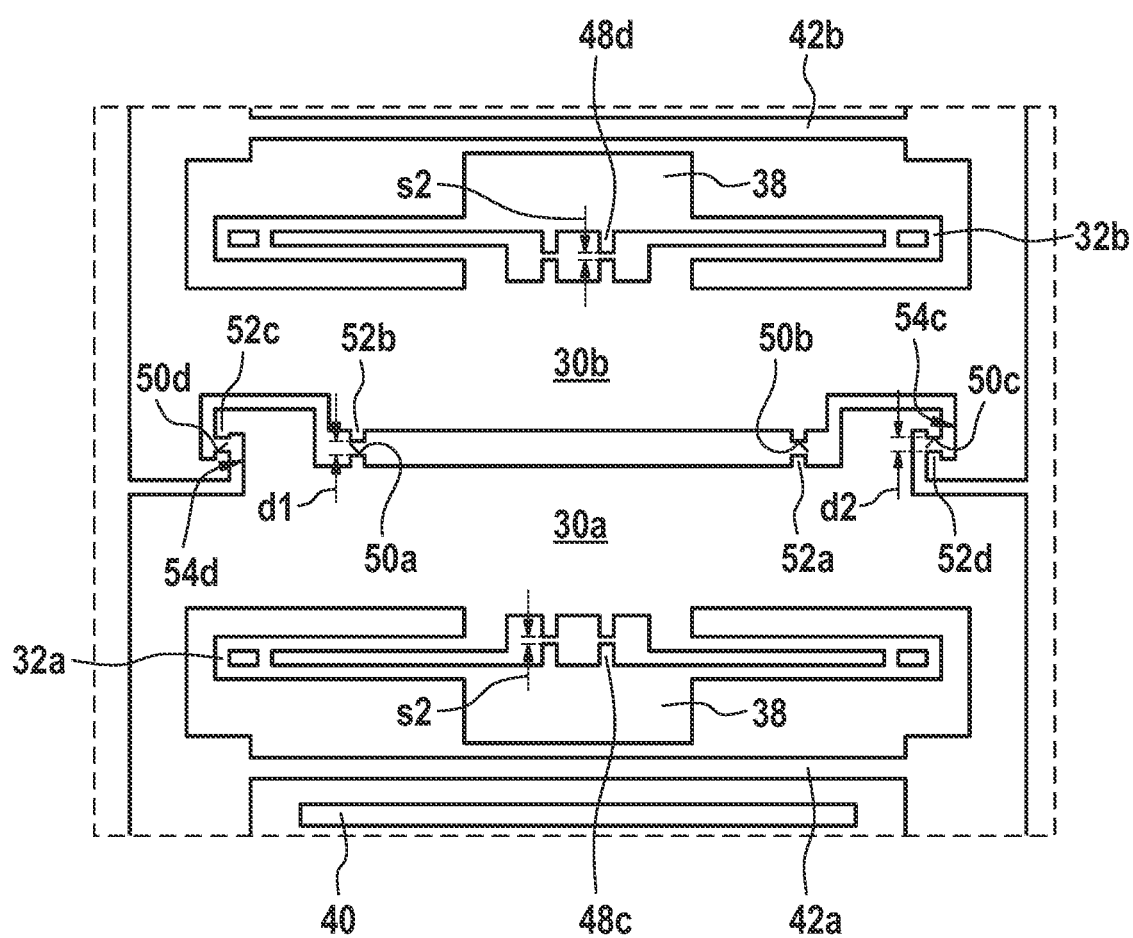

FIGS. 3a and 3b show schematic representations of a second specific embodiment of the micromechanical component.

As a further development of the specific embodiment previously described, in the case of the micromechanical component of FIGS. 3a and 3b, a third stop surface 50c of first seismic mass 30a and a fourth stop surface 50d of second seismic mass 30b are able to be brought together in mechanical contact. In particular, first seismic mass 30a and second seismic mass 30b are disposed in such a way relative to each other, and third stop surface 50c of first seismic mass 30a and fourth stop surface 50d of second seismic mass 30b are formed in such a way that fourth stop surface 50d of second seismic mass 30b, displaced out of its second position of rest into first direction 44 along second axis 36b, mechanically contacts third stop surface 50c of first seismic mass 30a adhering to third stop structure 48c. With the aid of the mechanical contact of fourth stop surface 50d of second seismic mass 30b with third stop surface 50c of first seismic mass 30a, an impulse may be transmitted from second seismic mass 30b to first seismic mass 30a adhering to third stop structure 48c, such that first seismic mass 30a is released from third stop structure 48c. In addition, third stop surface 50c of first seismic mass 30a, displaced out of its first position of rest into second direction 46 along first axis 36a, is advantageously able to mechanically contact fourth stop surface 50d of second seismic mass 30b adhering to its fourth stop structure 48d, so that an unwanted adhesion or stiction of second seismic mass 30b to its fourth stop structure 48d is also rectifiable again quickly by transmission of an impulse from first seismic mass 30a to second seismic mass 30b. The formation of third stop surface 50c of first seismic mass 30a and fourth stop surface 50d of second seismic mass 30b thus results in an additional improvement of the mechanical ruggedness and/or overload strength of the micromechanical component.

A second distance d2 of third stop surface 50c of first seismic mass 30a in its first position of rest to fourth stop surface 50d of second seismic mass 30b in its second position of rest is preferably greater than second limit distance s2 and equal to or less than double the second limit distance s2. This also ensures advantageous displaceability of the two seismic masses 30a and 30b during operation of the micromechanical component, so that as a rule, a mechanical contact of seismic masses 30a and 30b at their stop surfaces 50c and 50d only occurs in the event one of the two seismic masses 30a and 30b adheres to stop structure 48c or 48d assigned to it.

Preferably, third stop surface 50c is formed on a third limit-stop structure 52c of first seismic mass 30a, and fourth stop surface 50d is formed on a fourth limit-stop structure 52d of second seismic mass 30b. In this case, third limit-stop structure 52c and fourth limit-stop structure 52d may be formed in such a way that third limit-stop structure 52c of first seismic mass 30a extends at least partially into a lateral recess 54c of second seismic mass 30b open toward first axis 36a, and fourth limit-stop structure 52d of second seismic mass 30b extends at least partially into a lateral recess 54d of first seismic mass 30a open toward second axis 36b. As can be seen in FIG. 3b, in this way an alignment of third stop surface 50c of first seismic mass 30a with fourth stop surface 50d of second seismic mass 30b may be directed counter to an alignment of first stop surface 50a of first seismic mass 30a with second stop surface 50b of second seismic mass 30b. One may also describe this as an "interhooking design" of third limit-stop structure 52c and fourth limit-stop structure 52d. Consequently, a movement of first seismic mass 30a away from second seismic mass 30b is also able to bring about a release of second seismic mass 30b from fourth stop structure 48d, while a movement of second seismic mass 30b away from first seismic mass 30a is able to bring about a release of first seismic mass 30a from third stop structure 48c.

Limit-stop structures 52c and 52d may also take the form of knop-like limit-stops or knop-like limit-stop structures. In addition, first seismic mass 30a and second seismic mass 30b may also be formed with a plurality of third/fourth stop surfaces 50c and 50d, that is, with a plurality of third/fourth limit-stop structures 52c and 52d.

Reference is made to the description of FIGS. 2a and 2b with respect to further features of the micromechanical component of FIGS. 3a and 3b and their advantages.

Figure 4:
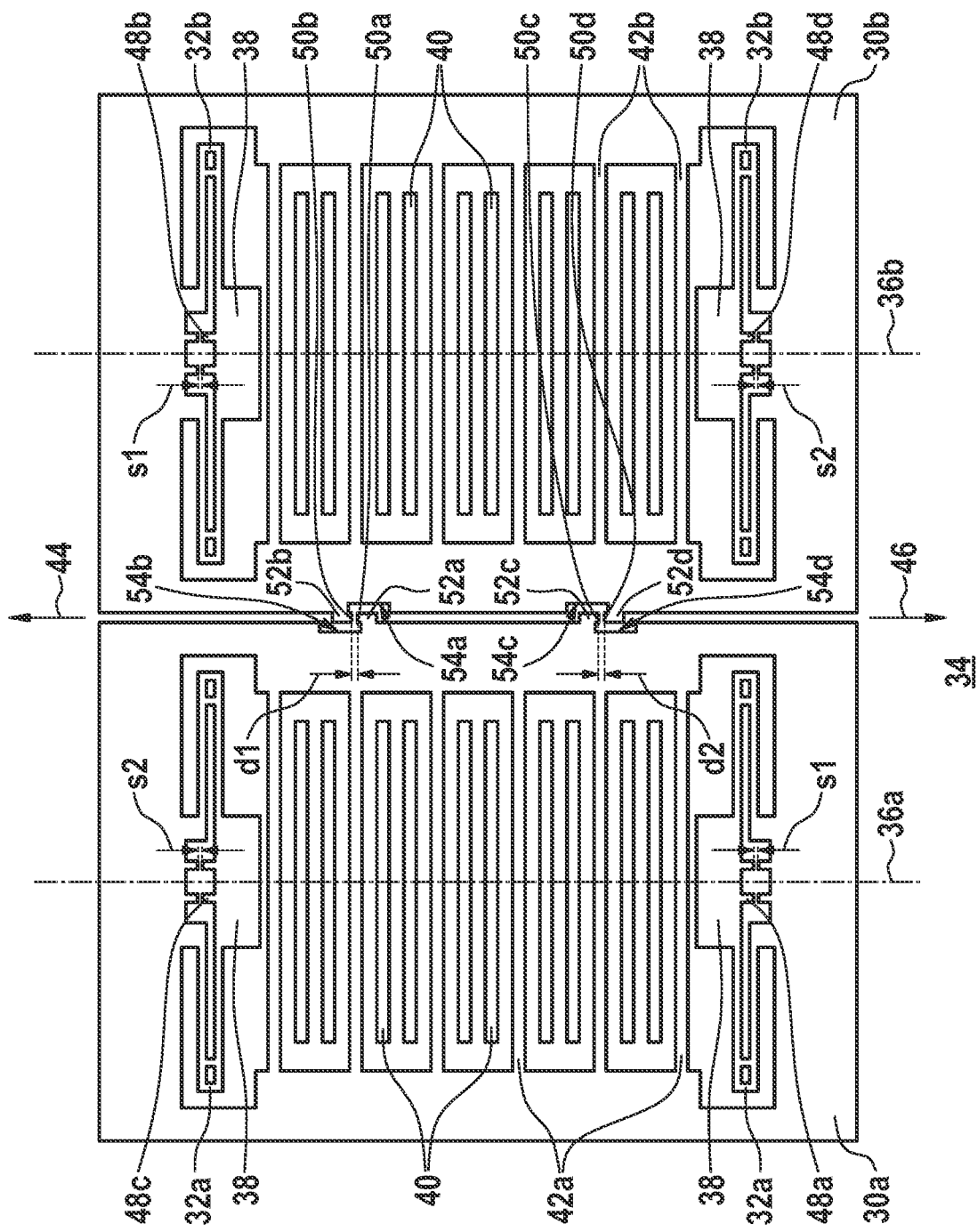
FIG. 4 shows a schematic representation of a third specific embodiment of the micromechanical component of the present invention.

FIG. 4 shows a schematic representation of a third specific embodiment of the micromechanical component.

In the case of the micromechanical component represented schematically in FIG. 4, second axis 36b runs parallel to first axis 36a. Seismic masses 30a and 30b are therefore situated "side-by-side." In addition, first limit-stop structure 52a of first seismic mass 30a extends at least partially into a lateral recess 54a of second seismic mass 30b open toward first axis 36a, while second limit-stop structure 52b of second seismic mass 30b extends at least partially into a second lateral recess 54b of first seismic mass 30a open toward second axis 36b. In the case of the micromechanical component of FIG. 4, both limit-stop structures 52a and 52b, as well as limit-stop structures 52c and 52d are therefore formed as "interlocking limit-stop structures."

Reference is made to the description of FIGS. 2a, 2b, 3a and 3b with respect to further features of the micromechanical component of FIG. 4 and their advantages.

In the case of all the micromechanical components described above, stop surfaces 50a to 50d, that is, limit-stop structures 52a to 52d contribute to an increase in robustness of the respective micromechanical component with respect to an unwanted stiction of one of its seismic masses 30a or 30b to an adjacent stop structure 48a to 48d. In the case of the micromechanical components described above, limit-stop structures 52a to 52d are designed in such a way that they do not appreciably influence either the static behavior (offset sensitivity) or the dynamic behavior (frequency, damping) of the respective micromechanical component, or more specifically, of a sensor device using the respective micromechanical component. In addition, the micromechanical components described above exhibit good compactness, which is why a requirement for additional space attributable to limit-stop structures 52a to 52d is negligible. Limit-stop structures 52a to 52d are rendered in FIGS. 2 to 4 as firm/inflexible limit-stop structures 52a to 52d. Alternatively, first limit-stop structure 52a of first seismic mass 30a, second limit-stop structure 52b of second seismic mass 30b, third limit-stop structure 52c of first seismic mass 30a and/or fourth limit-stop structure 52d of second seismic mass 30b may in each instance take the form of a flexible limit-stop structure. It is also pointed out that the formation of limit-stop structures 52a to 52d rendered as knop-like limit-stops in FIGS. 2 to 4 is to be interpreted only as an example.

The micromechanical components described above have only two seismic masses 30a and 30b. However, it is pointed out that such a micromechanical component may also be designed with at least three such seismic masses; stop surfaces 50a to 50d, that is, limit-stop structures 52a to 52d explained above may be formed on its at least three seismic masses.

Each of the micromechanical components described above may be used as (at least part of) a sensor device. In particular, such a micromechanical component may be utilized as (at least part of) an inertial sensor for detecting or measuring at least one acceleration component oriented along its axes 36a and 36b. A non-zero acceleration component oriented along axes 36a and 36b brings about a deflection at least of seismic masses 30a and 30b out of their positions of rest, so that a respective interspace between each of actuator electrodes 42a and 42b and the at least one stator electrode 40 assigned in each case changes. Utilizing conductor tracks (not sketched) formed on mount 34, the change of the respective interspace may be detected, e.g., by an external evaluation circuit, by picking off a change of voltage or determining a change in capacitance. In so doing, in particular, a differential signal may be evaluated, since given a suitable placement of actuator electrodes 42a and 42b and stator electrodes 40, the deflection at least of seismic masses 30a and 30b out of their positions of rest along axes 36a and 36b triggers positive and negative change of the respective interspace. As a further development, with at least three seismic masses, the micromechanical components may also be used for two-dimensional acceleration sensors.

Figure 5:
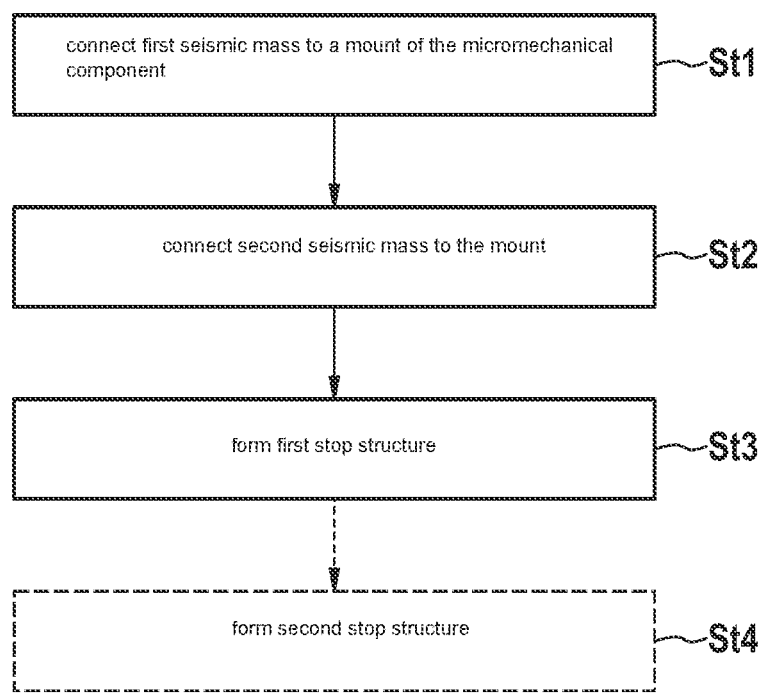
FIG. 5 shows a flowchart to illustrate a specific embodiment of the method for manufacturing a micromechanical component in accordance with the present invention.

FIG. 5 shows a flowchart for illustrating a specific embodiment of the method for manufacturing a micromechanical component.

In a method step St1, a first seismic mass is connected to a mount of the micromechanical component with the aid of at least one first spring device in such a way that the first seismic mass is displaceable out of its first position of rest at least along a first axis in relation to the mount, accompanied by deformation of the at least one first spring device. Correspondingly, as method step St2, a second seismic mass is connected to the mount with the aid of at least one second spring device in such a way that the second seismic mass is displaceable out of its second position of rest at least along a second axis in relation to the mount, accompanied by deformation of the at least one second spring device, the second axis lying parallel to the first axis or on the first axis. In a further method step St3, a first stop structure of the mount is formed in such a way that the first seismic mass, displaced out of its first position of rest by a first limit distance into a first direction along the first axis, mechanically contacts the first stop structure of the mount. However, in carrying out method steps St1 and St2, the first seismic mass and the second seismic mass may be disposed relative to each other in such a way that a second stop surface of the second seismic mass, displaced out of its second position of rest into a second direction counter to the first direction along the second axis, mechanically contacts a first stop surface of the first seismic mass adhering to the first stop structure. An unwanted adhesion or stiction of the first seismic mass to the first stop structure may thus be rectified quickly.

As optional method step St4, additionally a second stop structure of the mount may be formed in such a way that the first seismic mass, displaced out of its first position of rest by a second limit distance into the second direction along the first axis, mechanically contacts the second stop structure of the mount, in carrying out method steps St1 and St2, the first seismic mass and the second seismic mass being disposed relative to each other in such a way that a fourth stop surface of the second seismic mass, displaced out of its second position of rest into the first direction along the second axis, mechanically contacts a third stop surface of the first seismic mass adhering to the second stop structure. An unwanted adhesion or stiction of the first seismic mass to the second stop structure may therefore also be neutralized again by the transmission of an impulse from the second mass to the first mass.

Method steps St1 to St3, or method steps St1 to St4, may be carried out in any order as desired, partly overlapping in time or simultaneously. Preferably, the first stop surface is formed on a first limit-stop structure of the first seismic mass, the second stop surface is formed on a second limit-stop structure of the second seismic mass, the third stop surface is formed on a third limit-stop structure of the first seismic mass and/or the fourth stop surface is formed on a fourth limit-stop structure of the second seismic mass. Since the at least one limit-stop structure is realizable as an easily executable design measure, its formation is easily practicable and possible without (significant) additional cost.

In implementing the manufacturing method described here, further features of the micromechanical components explained above may also be realized. However, a description of these features again is omitted here. With respect to the applicability of the product of the manufacturing method described here, reference is made to the micromechanical components explained above.

What is claimed is:

1. A micromechanical component for a sensor device, comprising:
a first seismic mass which is connected using at least one first spring device to a mount of the micromechanical component in such a way that the first seismic mass is displaceable out of a first position of rest of the first seismic mass at least along a first axis in relation to the mount, accompanied by deformation of the at least one first spring device, the first seismic mass displaced out of the first position of rest by a first limit distance into a first direction along the first axis and mechanically contacting a first stop structure of the mount; and
a second seismic mass which is connected using at least one second spring device to the mount in such a way that the second seismic mass is displaceable out of a second position of rest of the second seismic mass at least along a second axis in relation to the mount, accompanied by deformation of the at least one second spring device, the second axis lying parallel to the first axis or on the first axis;
wherein the first seismic mass and the second seismic mass are disposed relative to each other in such a way that a second stop surface of the second seismic mass, with the second seismic mass displaced out of the second position of rest into a second direction counter to the first direction along the second axis, mechanically contacts a first stop surface of the first seismic mass adhering to the first stop structure, wherein the first stop structure outwardly protrudes from the mount and a second stop structure outwardly protrudes from the second seismic mass.

2. The micromechanical component as recited in claim 1, wherein the first seismic mass, displaced out of the first position of rest by a second limit distance into the second direction along the first axis, mechanically contacts a second stop structure of the mount, and the first seismic mass and the second seismic are disposed relative to each other in such a way that a fourth stop surface of the second seismic mass, with the second seismic mass displaced out of the second position of rest into the first direction along the second axis, mechanically contacts a third stop surface of the first seismic mass adhering to the second stop structure.

3. The micromechanical component as recited in claim 2, wherein the first seismic mass and the second seismic mass are disposed relative to each other in such a way that a first distance of the first stop surface of the first seismic mass in the first position of rest, to the second stop surface of the second seismic mass in the second position of rest, is greater than the first limit distance and equal to or less than double the first limit distance, and/or a second distance of the third stop surface of the first seismic mass in the first position of rest, to the fourth stop surface of the second seismic mass in the second position of rest, is greater than the second limit distance and equal to or less than double the second limit distance.

4. The micromechanical component as recited in claim 2, wherein the first stop surface is formed on a first limit-stop structure of the first seismic mass, and/or the second stop surface is formed on a second limit-stop structure of the second seismic mass, and/or the third stop surface is formed on a third limit-stop structure of the first seismic mass, and/or the fourth stop surface is formed on a fourth limit-stop structure of the second seismic mass.

5. The micromechanical component as recited in claim 4, wherein the first limit-stop structure of the first seismic mass, and/or the second limit-stop structure of the second seismic mass, and/or the third limit-stop structure of the first seismic mass, and/or the fourth limit-stop structure of the second seismic mass, in each case is a flexible limit-stop structure.

6. The micromechanical component as recited in claim 4, wherein the first limit-stop structure of the first seismic mass extends at least partially into a first lateral recess of the second seismic mass open toward the first axis, and/or the second limit-stop structure of the second seismic mass extends at least partially into a second lateral recess of the first seismic mass open toward the second axis, and/or the third limit-stop structure of the first seismic mass extends at least partially into a third lateral recess of the second seismic mass open toward the first axis, and/or the fourth limit-stop structure of the second seismic mass extends at least partially into a fourth lateral recess of the first seismic mass open toward the second axis.

7. A method for manufacturing a micromechanical component for a sensor device, comprising the following steps:
    connecting a first seismic mass to a mount of the micromechanical component using at least one first spring device in such a way that the first seismic mass is displaceable out of a first position of rest of the first seismic mass at least along a first axis in relation to the mount, accompanied by deformation of the at least one first spring device;
    connecting a second seismic mass to the mount using at least one second spring device in such a way that the second seismic mass is displaceable out of a second position of rest of the second seismic mass at least along a second axis in relation to the mount, accompanied by deformation of the at least one second spring device, the second axis lying parallel to the first axis or on the first axis; and
    forming a first stop structure of the mount in such a way that the first seismic mass, displaced out of the first position of rest by a first limit distance into a first direction along the first axis, mechanically contacts the first stop structure of the mount;
    wherein the first seismic mass and the second seismic mass are disposed relative to each other in such a way that a second stop surface of the second seismic mass, with the second seismic mass displaced out of the second position of rest into a second direction counter to the first direction along the second axis, mechanically contacts a first stop surface of the first seismic mass adhering to the first stop structure, wherein the first stop structure outwardly protrudes from the mount and a second stop structure outwardly protrudes from the second seismic mass.

8. The manufacturing method as recited in claim 7, further comprising:
    forming a second stop structure of the mount in such a way that the first seismic mass, displaced out of the first position of rest by a second limit distance into the second direction along the first axis, mechanically contacts the second stop structure of the mount, and wherein the first seismic mass and the second seismic mass are disposed in such a way relative to each other that a fourth stop surface of the second seismic mass, with the second seismic mass displaced out of the second position of rest into the first direction along the second axis, mechanically contacts a third stop surface of the first seismic mass adhering to the second stop structure.

9. The manufacturing method as recited in claim 8, wherein the first stop surface is formed on a first limit-stop structure of the first seismic mass, and/or the second stop surface is formed on a second limit-stop structure of the second seismic mass, and/or the third stop surface is formed on a third limit-stop structure of the first seismic mass and/or the fourth stop surface is formed on a fourth limit-stop structure of the second seismic mass.

10. The manufacturing method as recited in claim 9, wherein the first seismic mass and the second seismic mass are disposed relative to each other in such a way that a first distance of the first stop surface of the first seismic mass in the first position of rest, to the second stop surface of the second seismic mass in the second position of rest, is greater than the first limit distance and equal to or less than double the first limit distance, and/or a second distance of the third stop surface of the first seismic mass in the first position of rest, to the fourth stop surface of the second seismic mass in the second position of rest, is greater than the second limit distance and equal to or less than double the second limit distance.

* * * * *